United States Patent
Huang et al.

(10) Patent No.: US 11,610,996 B2
(45) Date of Patent: Mar. 21, 2023

(54) SEMICONDUCTOR STRUCTURE AND METHOD OF FORMING THE SAME

(71) Applicant: NANYA TECHNOLOGY CORPORATION, New Taipei (TW)

(72) Inventors: Sheng-Fu Huang, New Taipei (TW); Chung-Hsun Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 138 days.

(21) Appl. No.: 17/207,759

(22) Filed: Mar. 22, 2021

(65) Prior Publication Data

US 2021/0210638 A1 Jul. 8, 2021

Related U.S. Application Data

(62) Division of application No. 16/358,706, filed on Mar. 20, 2019, now Pat. No. 10,991,828.

(51) Int. Cl.
| | |
|---|---|
| *H01L 21/8234* | (2006.01) |
| *H01L 29/786* | (2006.01) |
| *H01L 29/66* | (2006.01) |
| *H01L 29/49* | (2006.01) |
| *H01L 21/033* | (2006.01) |
| *H01L 21/311* | (2006.01) |
| *H01L 21/285* | (2006.01) |
| *H01L 21/02* | (2006.01) |
| *H01L 21/768* | (2006.01) |

(52) U.S. Cl.
CPC .... *H01L 29/78609* (2013.01); *H01L 21/0217* (2013.01); *H01L 21/0228* (2013.01); *H01L 21/02164* (2013.01); *H01L 21/0337* (2013.01); *H01L 21/28518* (2013.01); *H01L 21/31111* (2013.01); *H01L 21/76897* (2013.01); *H01L 29/4908* (2013.01); *H01L 29/4933* (2013.01); *H01L 29/665* (2013.01); *H01L 29/66742* (2013.01)

(58) Field of Classification Search
CPC ...................... H01L 21/823418; H01L 29/665
See application file for complete search history.

(56) References Cited

U.S. PATENT DOCUMENTS

| | | | |
|---|---|---|---|
| 9,947,753 B2* | 4/2018 | Hung | H01L 29/0847 |
| 10,991,828 B2* | 4/2021 | Huang | H01L 21/28518 |
| 2016/0308016 A1 | 10/2016 | Choi et al. | |

FOREIGN PATENT DOCUMENTS

CN 106158931 11/2016

OTHER PUBLICATIONS

"Office Action of China Counterpart Application", dated Apr. 22, 2022, p. 1-p. 8.

* cited by examiner

*Primary Examiner* — Mark V Prenty
(74) *Attorney, Agent, or Firm* — JCIPRNET

(57) ABSTRACT

A semiconductor structure and a method of forming the same are provided. In the semiconductor structure, contact spacers are formed at least on sidewalls of contact trenches in the substrate, so that the distance between the gate and the silicide layers disposed only on the bottom surfaces, rather than on the sidewalls and the bottom surfaces, of the contact trenches can be increased, and thus the current leakage induced by gate can be decreased.

8 Claims, 3 Drawing Sheets

SEMICONDUCTOR STRUCTURE AND METHOD OF FORMING THE SAME

CROSS-REFERENCE TO RELATED APPLICATION

This application is a divisional application of and claims the priority benefit of U.S. application Ser. No. 16/358,706, filed on Mar. 20, 2019, now allowed. The entirety of the above-mentioned patent application is hereby incorporated by reference herein and made a part of this specification.

BACKGROUND

1. Field of this Invention

This disclosure is related to a semiconductor structure, especially related to a semiconductor structure for preventing current leakage induced by gate.

2. Description of Related Art

After forming contact openings on source and drain of a MOS FET, silicide layers are often formed on the surface of the source and drain to decrease the contact resistance. However, as the critical dimension is decreased as the integration is increased, drain leakage current is also increased to adversely affect the performance of the MOS-FET.

SUMMARY

According to one aspect of this invention, a semiconductor structure is provided to decrease the current leakage induced by gate.

The semiconductor structure above comprises a gate structure disposed on a substrate; a source and a drain disposed in the substrate on two sides of the gate structure; a dielectric layer disposed on the substrate and the gate structure; two contact openings disposed in the dielectric layer to respectively expose the source and the drain; two contact trenches disposed in the source and drain and under the two contact openings, respectively; two contact spacers respectively covering sidewalls of the contact trenches for avoiding current leakage induced by gate; two silicide layers disposed under the bottom surface of the contact trenches; and two contact plugs filled in the contact trenches and the contact openings.

In some embodiments of this invention, the contact spacers further cover sidewalls of the contact openings.

In some other embodiments of this invention, the material of the contact spacers comprises silicon oxide or silicon nitride.

In yet some other embodiments of this invention, the material of the silicide layers comprises $TiSi_2$, $NiSi_2$, or $CoSi_2$.

According to another aspect of this invention, a method of forming the semiconductor structure is also provided. First, a gate structure is formed on a substrate, and a source and a drain are then formed in the substrate on two sides of the gate structure. A dielectric layer is formed on the substrate and the gate structure. Next, two contact openings are formed in the dielectric layer to respectively expose the source and the drain. Subsequently, two contact trenches are formed in the source and drain and under the two contact openings, respectively. Two contact spacers are formed to respectively cover sidewalls of the contact trenches for avoiding current leakage induced by gate. Two silicide layers are formed under the bottom surface of the contact trenches. Then, two contact plugs are formed to fill the contact trenches and the contact openings.

In some embodiments of this invention, the contact spacers may be formed by forming contact dielectric layers respectively on surfaces of the contact trenches by thermal oxidation or thermal nitridation; and then anisotropically etching the contact dielectric layers to form the contact spacers on the sidewalls of the contact trenches and expose the substrate.

In some other embodiments of this invention, the contact spacers may be formed by forming a contact dielectric layer conformally covering exposed surfaces of the dielectric layer, the contact openings and the contact trenches; and then anisotropically etching the contact dielectric layer to form the contact spacers on the sidewalls of the contact openings and the contact trenches and expose the substrate.

In yet some other embodiments of this invention, a hard mask layer is formed on the dielectric layer between the dielectric layer is formed and the contact openings are formed. The hard mask layer is used as an etching mask when the dielectric layer is etched to form the contact openings. The hard mask layer is removed between the two contact spacers are formed and the silicide layers are formed.

In light of the foregoing, since the contact spacers are formed at least on sidewalls of the contact trenches in the substrate, so that the distance between the gate and the silicide layers below the bottom surfaces, rather than on the sidewalls and the bottom surfaces, of the contact trenches can be increased, and thus the current leakage induced by gate can be decreased.

BRIEF DESCRIPTION OF THE DRAWINGS

FIGS. 1A-1B and 3A-3B are schematic cross-sectional views showing a process of forming a semiconductor structure according to another embodiment of this invention.

DESCRIPTION OF THE EMBODIMENTS

FIGS. 1A-1B and 2A-2B are schematic cross-sectional views showing a process of forming a semiconductor structure according to an embodiment of this invention. FIGS. 1A-1B and 3A-3B are schematic cross-sectional views showing a process of forming a semiconductor structure according to another embodiment of this invention.

Figure 1A:
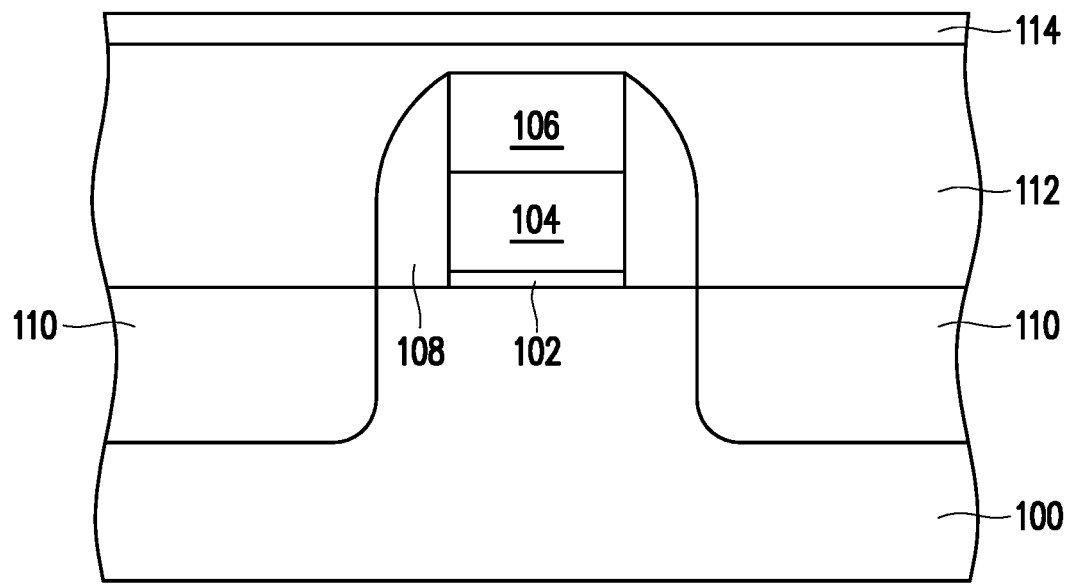
FIGS. 1A-1B and 2A-2B are schematic cross-sectional views showing a process of forming a semiconductor structure according to an embodiment of this invention.

In FIG. 1A, a gate dielectric layer 102, a gate layer 104 and a gate mask layer 106 are sequentially formed on a substrate 100. Next, the gate dielectric layer 102, the gate layer 104, and the gate mask layer 106 are patterned by a patterning process, such as photolithography and etching, to form a gate structure having the gate dielectric layer 102, the gate layer 104 and the gate mask layer 106. In this step, the gate mask layer 106 is used as an etching mask when the gate layer 104 and the gate dielectric layer 102 are etched. The gate dielectric layer 102 may be a silicon oxide layer, or a high-k dielectric layer such as a hafnium oxide layer or a zirconium oxide layer. The gate layer 104 is a conductive layer, such as a doped polysilicon layer or a metal layer (e.g. a tungsten layer). The gate mask layer 106 may be a silicon oxide layer.

Next, an insulating layer, such as a silicon oxide layer, is conformally formed on the substrate 100 and the gate structure, and then anisotropically etched to form gate spacers 108 on sidewalls of the gate structure. Subsequently, source/drain 110 are formed in the substrate 100 on two sides of the gate structure by ion implantation. A dielectric layer 112 and a hard mask layer 114 are sequentially formed on the substrate 100. The dielectric layer 112 may be a silicon oxide layer or a low-k dielectric layer, such as a fluorine-doped silicon oxide layer, a carbon-doped oxide layer (CDO), a porous silicon oxide layer, or a spin-on glass layer. The hard mask layer 114 may be a silicon nitride layer.

Figure 1B:
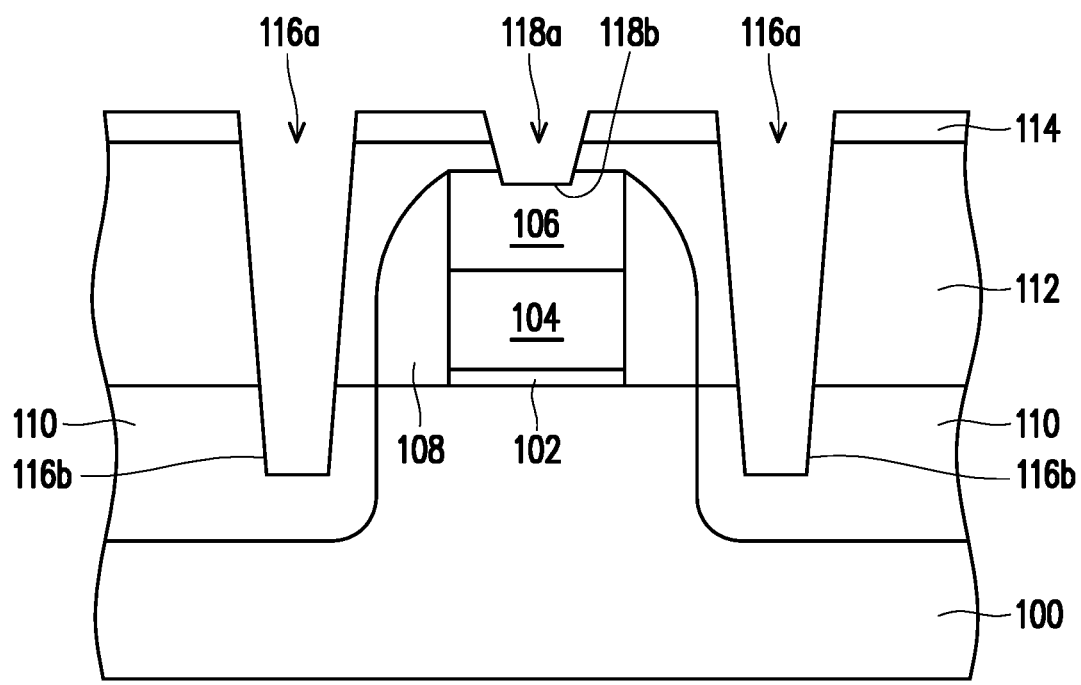

In FIG. 1B, the hard mask layer 114 and the dielectric layer 112 are patterned, such as photolithography and etching, to form contact openings 116a and a gate opening 118a in the dielectric layer 112. Then, the exposed substrate 100 under the contact openings 116a and the exposed gate mask layer 106 under the gate opening 118a are subsequently over etched to form contact trenches 116b in the source/drain 110 in the substrate 100 and a gate trench 118b in the gate mask layer 106. In this etching process, the hard mask layer 114 is used as an etching mask.

Next, there are two choices may be made to complete the rest of the process of forming the semiconductor structure. The first choice is depicted in FIGS. 2A and 2B, the second choice is depicted in FIGS. 3A and 3B.

Figure 2A:
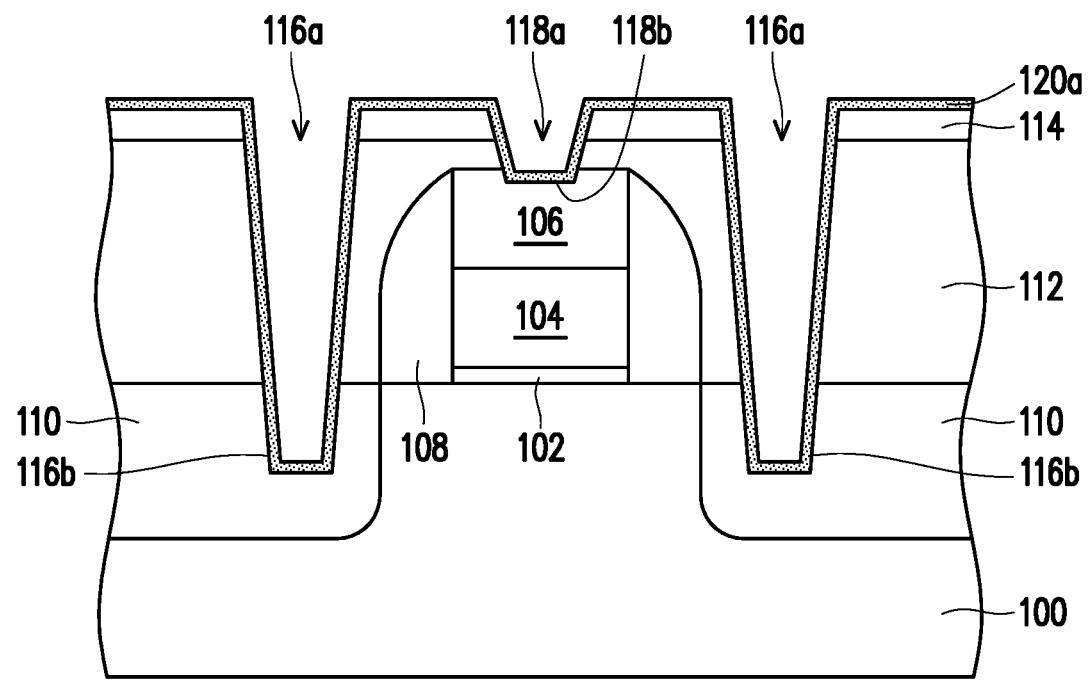
Figure 3A:
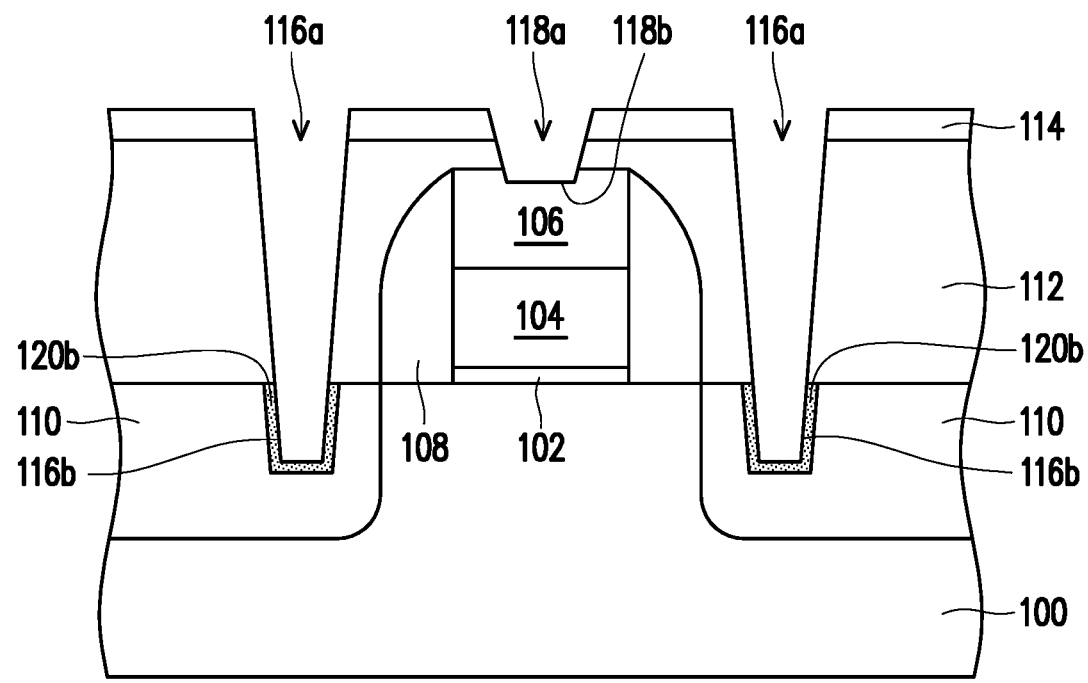
Figure 3B:
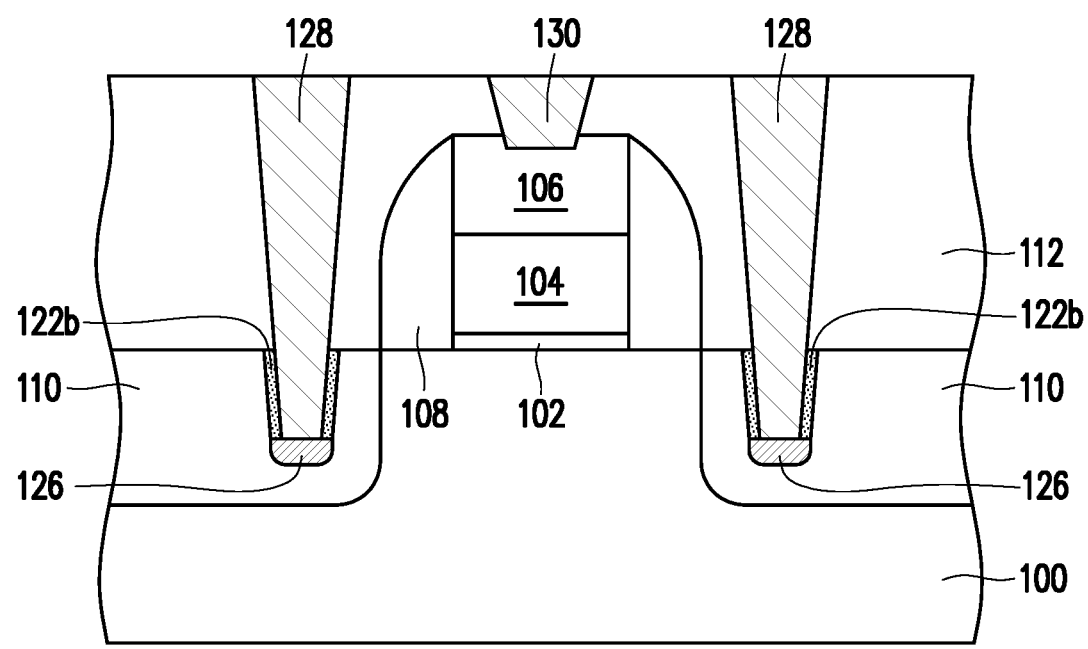

In FIG. 2A of the first choice, a contact dielectric layer 120a is conformally formed on the exposed surfaces of the substrate 100, the dielectric layer 112, and the hard mask layer 114. The contact dielectric layer 120a may be a silicon oxide layer or a silicon nitride layer, and the method of forming the contact dialectic layer may be chemical vapor deposition (CVD).

Figure 2B:
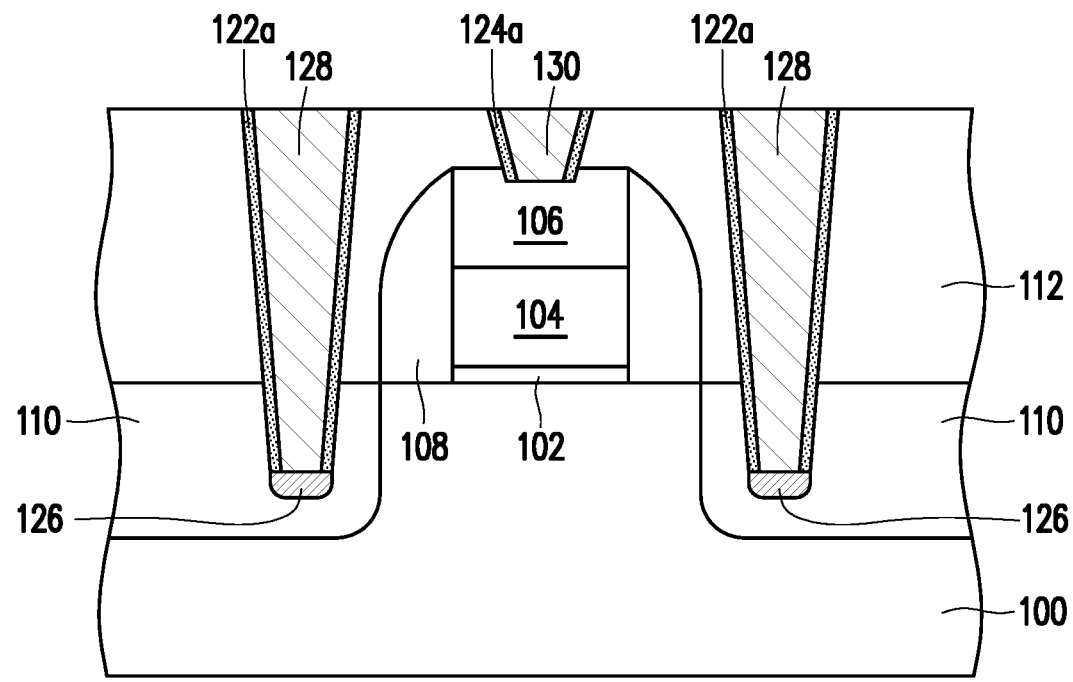

In FIG. 2B of the first choice, the contact dielectric layer 120a is then anisotropically etched to respectively form contact spacers 122a on the sidewalls of the contact openings 116a and the contact trenches 116b to expose the substrate 100, as well as gate contact spacers 124a on sidewalls of the gate opening 118a and the gate trench 118b to expose the gate mask layer 106. Please note that the exposed sidewall of the contact trenches 116b are covered by the contact spacers 122a, only the bottom surface of the contact trenches 116b are not covered by the contact spacers 122a to expose the substrate 100.

Then, metal silicide layers 126 are formed on the exposed substrate 100 by a salicidation process, which comprises depositing a metal layer and then performing a thermal process to allow the metal layer react with the exposed substrate 100 to form the silicide layers 126. The metal silicide layers may be $TiSi_2$, $NiSi_2$, or $CoSi_2$, for example.

In this step, since contact spacers 122a cover the sidewalls of the contact trenches 116b, the metal silicide layers 126 may be formed only on the bottom surface of the contact trenches 116b, and no metal silicide can be formed on sidewalls of the contact trenches 116b. Therefore, the distance between the conductive metal silicide layers 126 and the gate layer 104 can be kept at a distance far enough to avoid current leakage induced by the gate layer 104.

Next, the hard mask layer 114 is removed, and a metal layer is deposited to fill the contact openings 116a, the contact trenches 116b, the gate opening 118a and the gate trench 118b, and then etched back. Thus, contact plugs 128 are formed in the contact openings 116a and the contact trenches 116b, and a gate plug 130 is formed in the gate opening 118a and the gate trench 118b. The metal layer may be a tungsten layer.

In FIG. 3A of the second choice, a contact dielectric layer 120b is formed only on the exposed surfaces of the contact trenches 116b in the substrate 100. The contact dielectric layer 120b may be a silicon oxide layer or a silicon nitride layer, and may be formed by a thermal oxidation process or a thermal nitridation process.

In FIG. 3B of the second choice, the contact dielectric layer 120b is then anisotropically etched to form contact spacers 122b on the sidewalls of the contact trenches 116b in the substrate 100 to expose the substrate 100. Please note that the exposed sidewall of the contact trenches 116b are covered by the contact spacers 122b, only the bottom surface of the contact trenches 116b are not covered by the contact spacers 122b to expose the substrate 100.

Then, metal silicide layers 126 are formed on the exposed substrate 100 by a salicidation process, which comprises depositing a metal layer and then performing a thermal process to allow the metal layer react with the exposed substrate 100 to form the silicide layers 126. The metal silicide layers may be $TiSi_2$, $NiSi_2$, or $CoSi_2$, for example.

In this step, since contact spacers 122b cover the sidewalls of the contact trenches 116b, the metal silicide layers 126 may be formed only on the bottom surface of the contact trenches 116b, and no metal silicide can be formed on sidewalls of the contact trenches 116b. Therefore, the distance between the conductive metal silicide layers 126 and the gate layer 104 can be kept at a distance far enough to avoid current leakage induced by the gate layer 104.

In light of the foregoing, since the contact spacers are formed at least on sidewalls of the contact trenches in the substrate, so that the distance between the gate and the silicide layers below the bottom surfaces, rather than on the sidewalls and the bottom surfaces, of the contact trenches can be increased, and thus the current leakage induced by gate can be decreased.

Although implementations of the present invention have been described above in detail in combination with the attached drawings, the above-described implementations could not be interpreted as limitation to the present invention. Various modifications can be made by those skilled in the art within their knowledge without departing from the spirit and scope of the present invention.

What is claimed is:

1. A method of forming a semiconductor, the method comprising:
    forming a gate structure on a substrate;
    forming a source and a drain in the substrate on two sides of the gate structure;
    forming a dielectric layer on the substrate and the gate structure;
    forming two contact openings in the dielectric layer to respectively expose the source and the drain;
    forming a hard mask layer on the dielectric layer between the step of forming the dielectric layer and the step of forming the contact openings, wherein the hard mask layer is used as an etching mask;
    forming two contact trenches in the source and drain and under the two contact openings, respectively;
    forming two contact spacers to respectively cover sidewalls of the contact trenches for avoiding current leakage induced by the gate structure;
    forming two silicide layers under the bottom surface of the contact trenches; and
    forming two contact plugs to fill the contact trenches and the contact openings, wherein the hard mask layer is removed between the step of forming the silicide layers and the step of forming the contact plugs.

2. The method of claim 1, wherein the step of forming the contact spacers comprises:
forming contact dielectric layers respectively on surfaces of the contact trenches by thermal oxidation or thermal nitridation; and
anisotropically etching the contact dielectric layers to form the contact spacers on the sidewalls of the contact trenches and expose the substrate.

3. The method of claim 1, wherein the step of forming the contact spacers comprises:
forming a contact dielectric layer conformally covering exposed surfaces of the dielectric layer, the contact openings and the contact trenches; and
anisotropically etching the contact dielectric layer to form the contact spacers on the sidewalls of the contact openings and the contact trenches and expose the substrate.

4. The method of claim 3, wherein the contact dielectric layer is formed by chemical vapor deposition.

5. The method of claim 3, wherein the contact dielectric layer is a silicon oxide layer or a silicon nitride layer.

6. The method of claim 1, wherein a material of the silicide layers comprises $TiSi_2$, $NiSi_2$, or $CoSi_2$.

7. The method of claim 1, wherein the step of forming the gate structure comprises:
forming a gate dielectric layer on the substrate;
forming a gate layer on the gate dielectric layer;
forming a gate mask layer on the gate layer; and
sequentially patterning the gate mask layer, the gate layer and the gate dielectric layer to form the gate structure.

8. The method of claim 7, further comprising forming two gate spacers on sidewalls of the gate structure between the step of forming the gate structure and the step of forming the source and the drain.

* * * * *